United States Patent
Dong et al.

(10) Patent No.: US 6,964,913 B2
(45) Date of Patent: Nov. 15, 2005

(54) METHOD FOR FORMING FLOATING GATE IN FLASH MEMORY DEVICE

(75) Inventors: Cha Deok Dong, Ichon-Shi (KR); Il Keoun Han, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 68 days.

(21) Appl. No.: 10/720,408

(22) Filed: Nov. 24, 2003

(65) Prior Publication Data
US 2004/0266135 A1 Dec. 30, 2004

(30) Foreign Application Priority Data
Jun. 30, 2003 (KR) .................... 10-2003-0043619

(51) Int. Cl.⁷ .............................................. H01L 21/76
(52) U.S. Cl. .................... 438/437; 438/424; 438/435
(58) Field of Search ................... 438/424, 425, 438/435, 437

(56) References Cited

U.S. PATENT DOCUMENTS

| | | | |
|---|---|---|---|
| 6,326,283 B1 * | 12/2001 | Liang et al. | 438/424 |
| 6,620,681 B1 * | 9/2003 | Kim et al. | 438/257 |
| 2002/0019113 A1 * | 2/2002 | Chung | 438/424 |
| 2003/0203571 A1 * | 10/2003 | Rabkin et al. | 438/257 |

* cited by examiner

*Primary Examiner*—Christian Wilson
(74) *Attorney, Agent, or Firm*—Marshall, Gerstein & Borun LLP

(57) ABSTRACT

The present invention is provided to form a floating gate of a flash memory device capable of restricting a thickness of a buffer oxide film to a thickness less than 50 Å to minimize increment in a thickness due to a wall oxidation process in the case of depositing the buffer oxide film prior to depositing the first polysilicon film and the pad nitride film, and reducing a thickness of the first polysilicon film with an HF dip time minimized in a pre-treatment cleaning process prior to depositing the second polysilicon film, and protecting the first polysilicon film from being attacked in a pad nitride film strip process, by removing at least 50% of the buffer oxide film in the pad nitride film strip process.

5 Claims, 6 Drawing Sheets

METHOD FOR FORMING FLOATING GATE IN FLASH MEMORY DEVICE

BACKGROUND

1. Technical Field

A method for forming a floating gate in a flash memory device is disclosed capable of preventing a thickness of a buffer oxide film from being increased due to a first polysilicon film in a subsequent wall oxidation process, and which is capable of minimizing an attack of the first polysilicon film during a pad nitride film strip process.

2. Discussion of Related Art

In recent, a self-aligned shallow trench isolation (SA-STI) process has been used as a device isolation process in realizing a highly integrated NAND flash memory device. Accordingly, a floating gate is divided into a first polysilicon film and a second polysilicon film to form a stack structure. At that time, a buffer oxide film is deposited with a suitable thickness prior to depositing the first polysilicon film and a pad nitride film for the purpose of relieving a stress between the pad nitride film and the first polysilicon film. This buffer oxide film is used as a barrier film for relieving a stress between a pad nitride film and the first polysilicon film and preventing the first polysilicon film from being damaged in the pad nitride film strip process. Next, the buffer oxide film is removed in a pre-treatment cleaning process of a second polysilicon film and then a high-density plasma (HDP) oxide film is deposited and etched to form a slowness profile. However, as shown in FIG. 13, the first polysilicon film is oxidized during a subsequent wall oxidation process, thereby increasing a thickness of the buffer oxide film. Accordingly, as shown in FIG. 14, the buffer oxide film remains at an interface between the first polysilicon film and the second polysilicon film. Since the remaining buffer oxide film is completely removed in the pre-treatment cleaning process of the second polysilicon film, an over HF dip time is required for completely removing the buffer oxide film. In addition, a real thickness of the first polysilicon film is decreased to 10% to 20% of the thickness at the time of depositing the first polysilicon film. In oxidation of the first polysilicon film, oxidation degree of the wall oxidation process is different depending on magnitude of a critical dimension of the isolation thereof, whereby the thickness thereof increased at that time is also different. Accordingly, there is a problem that the buffer oxide film cannot uniformly remain over a whole surface of a wafer.

SUMMARY OF THE DISCLOSURE

Accordingly, a method for a floating gate in a flash memory device is disclosed which is capable of preventing a thickness of a buffer oxide film from being increased due to a first polysilicon film in a subsequent wall oxidation process according to a deposition of the buffer oxide film and which is capable of minimizing an attack of the first polysilicon film during a pad nitride film strip process.

One disclosed method for forming a floating gate in a flash memory device, comprises: (a) providing a semiconductor substrate on which a tunnel oxide film and a first polysilicon film are formed; (b) forming a buffer oxide film and a pad nitride film on the first polysilicon film sequentially; (c) forming a trench in the semiconductor substrate; (d) depositing a device isolation oxide film to bury the trench, and then performing a planarization process using the pad nitride film as a barrier; (e) carrying out a strip process to remove the pad nitride film and at least 50% of the buffer oxide film, at the same time; (f) removing the buffer oxide film using a pre-treatment cleaning process; (g) and depositing a second polysilicon film on a whole structure and patterning the second polysilicon film through a patterning process, whereby forming a floating gate including the first polysilicon film and the second polysilicon film.

In the aforementioned of a method for forming a floating gate in a flash memory device according to another embodiment, the buffer oxide film is deposited with a thickness in the range of 30 Å to 40 Å.

In the aforementioned of a method for forming a floating gate in a flash memory device according to another embodiment, the buffer oxide film is deposited using high temperature oxide (HTO), tetra ethyl ortho silicate (TEOS), and DCS-HTO (DiChloroSilane ($SiH_2Cl_2$)-HTO).

In the aforementioned of a method for forming a floating gate in a flash memory device according to another embodiment, after the step (c), further comprising a step of performing a wall oxidation process for forming a wall oxide film on an inner surface of the trench and on inside walls of the tunnel oxide film, the first polysilicon film, and the buffer oxide film.

In the aforementioned of a method for forming a floating gate in a flash memory device according to another embodiment, the wall oxidation process is carried out at a temperature in the range of 800° C. to 1000° C.

BRIEF DESCRIPTION OF THE DRAWINGS

The above and other, advantages and features will become apparent from the following description of preferred embodiments given in conjunction with accompanying drawings, wherein.

DETAILED DESCRIPTION OF THE PRESENTLY PREFERRED EMBODIMENTS

Now, preferred embodiments will be described in detail with reference to the appended drawings. However, this disclosure is not limited to the embodiments disclosed in the following description, but various changes and modifications will be apparent to those skilled in the art.

FIGS. 1 to 9 are cross-sectional views illustrating a method of forming a floating gate of a flash memory device according to one embodiment.

Figure 1:
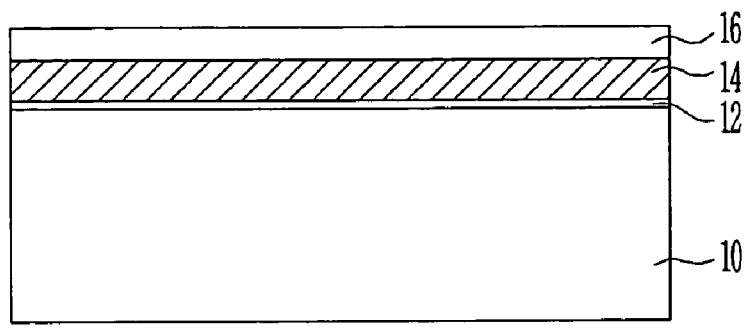
FIGS. 1 to 9 are cross-sectional views illustrating a disclosed method for forming a floating gate in a flash memory device.

Referring to FIG. 1, a semiconductor substrate 10 cleaned using a pre-treatment cleaning process is provided. In case of performing the pre-treatment cleaning process, a diluted HF (DHF) is used and then an SC-1 ($NH_4OH/H_2O_2/H_2O$) is used, or a buffer oxide etchant (BOE) is used and then the SC-1 is used. An ion implantation process for forming wells (not shown) and an ion implantation process for controlling a threshold voltage are carried out after the cleaning process is carried out. At that time, the ion implantation processes are carried out using a sacrificial oxide film (not shown) as a screen oxide film. Accordingly, a well area is formed on the semiconductor substrate 10. A tunnel oxide film 12 is formed on the semiconductor substrate 10 after the ion implantation processes are finished. On the other hand, although not shown, a high voltage gate oxide film may be formed on an area where a high voltage transistor is to be formed.

A first polysilicon film 14 is deposited on the tunnel oxide film 12 after the tunnel oxide film 12 is formed. At that time, the first polysilicon film 14 is an undoped amorphous silicon film, and is deposited with a thickness in the range of 300 Å to 500 Å using an low pressure chemical vapor deposition (LP-CVD) method. The LP-CVD method is carried out using $SiH_4$ gas as source gas at a temperature in the range of 480° C. to 550° C. under a pressure in the range of 0.1 torr to 1 torr.

Figure 10:
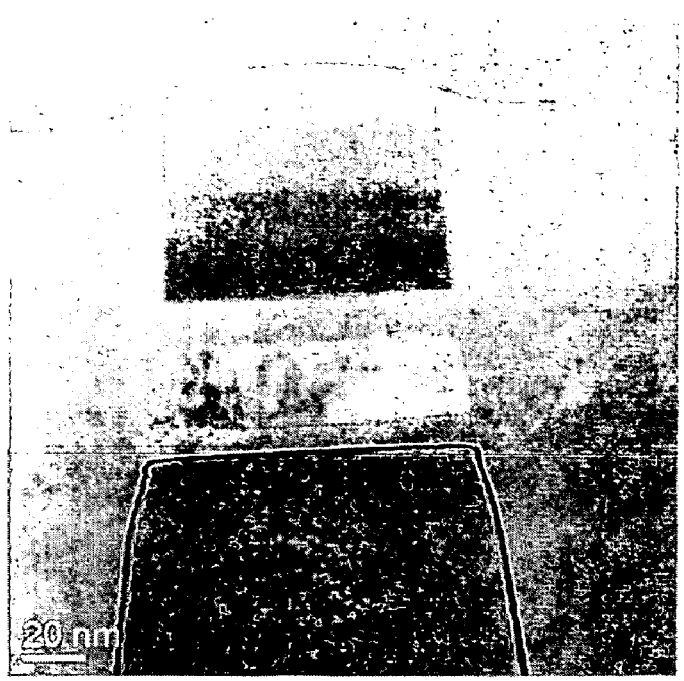
Figure 11:
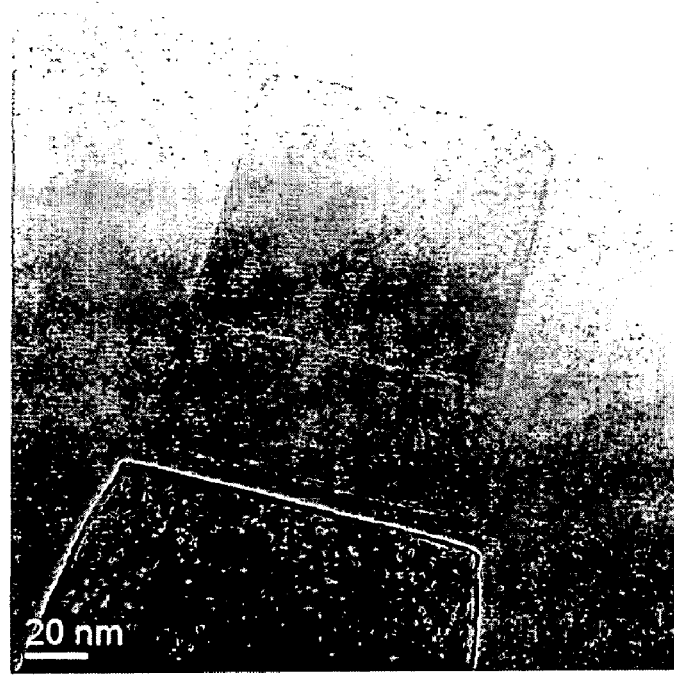
FIG. 11 is a TEM photograph showing a profile formed using a disclosed method of depositing a buffer oxide film.
Figure 12:
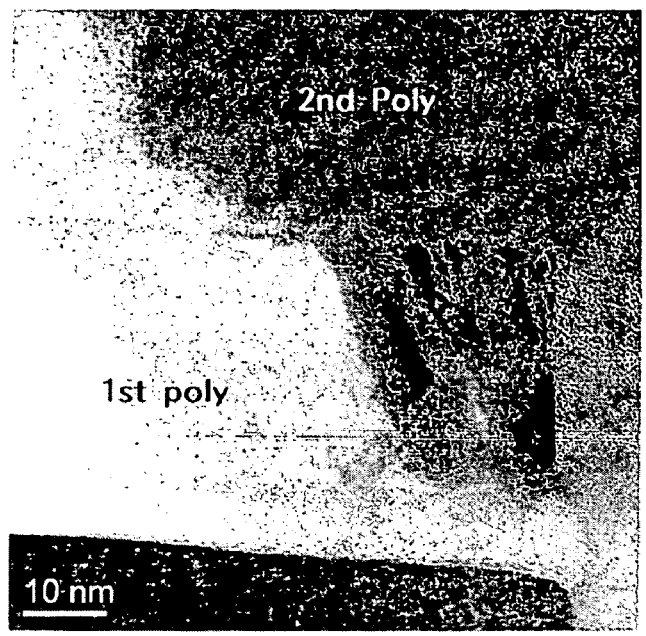
FIG. 12 is a TEM photograph showing profiles of a first polysilicon film and a second polysilicon film formed according to a disclosed embodiment.
Figure 13:
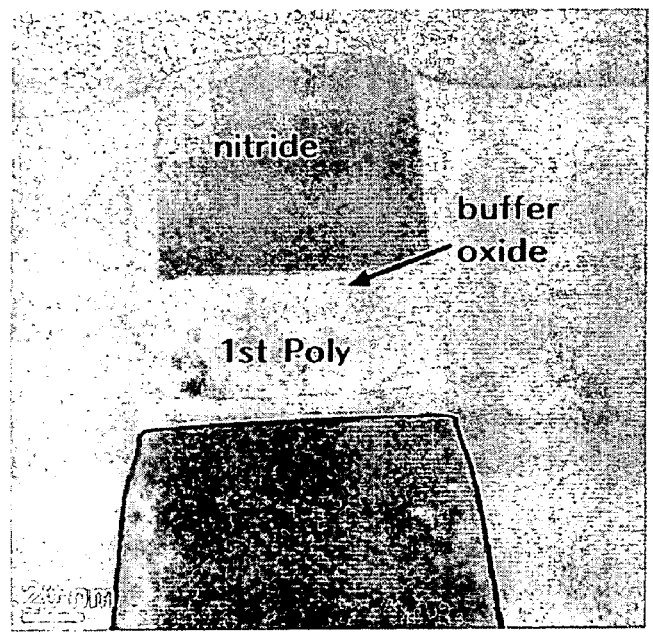
FIGS. 13 and 14 are TEM photographs showing profiles of the first polysilicon film and the second polysilicon film formed using the conventional method.
Figure 14:
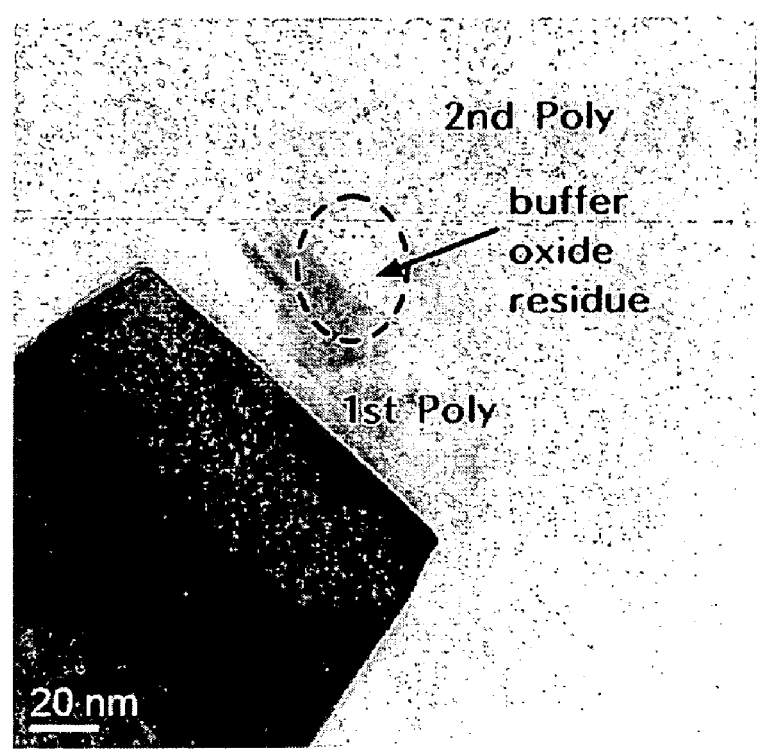

A buffer oxide film 16 is formed on the first polysilicon film 14 after the first polysilicon film 14 is formed. The buffer oxide film 16 is formed by selectively using an oxide film group such as HTO, TEOS, and DCS-HTO. In addition, it is preferable that the buffer oxide film 16 is deposited with a thickness less than 50 Å. The reason is that the first polysilicon film 14 is oxidized in a subsequent wall oxidation process shown in FIG. 4 to prevent from decrement in a thickness of the first polysilicon film 14 and prevent from non-uniformly increment in a thickness of the buffer oxide film 16. This result can be confirmed through the TEM photographs shown in FIGS. 10 and 11. FIG. 10 is a profile of a case that a buffer oxide film 16 is deposited using the conventional method of depositing a buffer oxide film, and FIG. 11 is a profile of a case that the buffer oxide film 16 is formed to have a thickness less than 50 Å, for example, 30 Å to 50 Å similarly to a preferred embodiment of the present invention. FIG. 11 shows a significantly good profile in which oxidation degree of the first polysilicon film 14 is relatively low, whereby increment in a thickness of the buffer oxide film 16 is less than 5 Å, in case of a preferable embodiment of the present invention. As shown in FIG. 12, a complete floating gate, in which the buffer oxide film 16 do not remain at an interface after a second polysilicon film 26 (see FIG. 8), is obtain.

Figure 2:
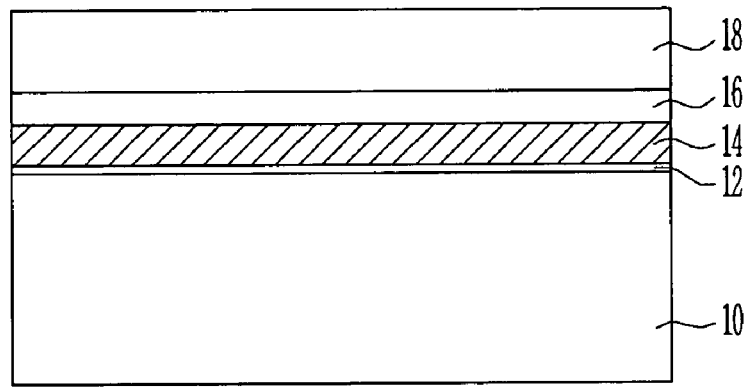

Referring to FIG. 2, a pad nitride film 18 is formed on the buffer oxide film 16 after the buffer oxide film 16 is formed in FIG. 1. At that time, the pad nitride film 18 is deposited using an LP-CVD method.

Figure 3:
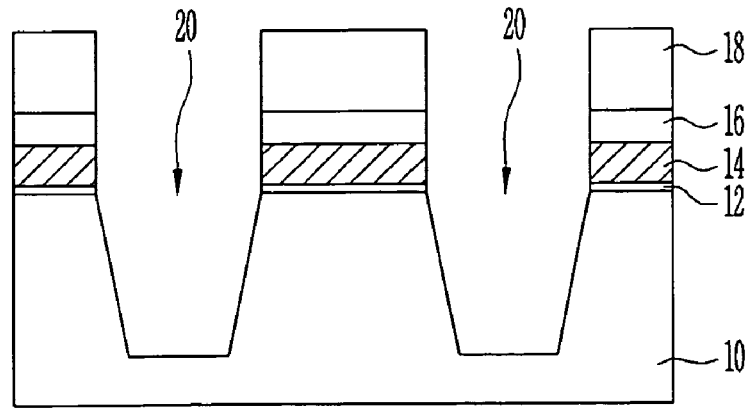

Referring to FIG. 3, a pad nitride film 18 is formed in FIG. 2, and then a semiconductor substrate 10 is coated with photoresist and a device isolation mask (not shown) is formed by an exposing process and a developing process using a photo mask. Next, the pad nitride film 18, the buffer oxide film 16, the first polysilicon film 14, the tunnel oxide film 12, and the semiconductor substrate 10 are sequentially patterned. Accordingly, the trench 20 of an STI structure is formed in the semiconductor substrate 10, thereby defining a field area and an active area. Next, the element isolation mask is removed using a strip process.

Figure 4:
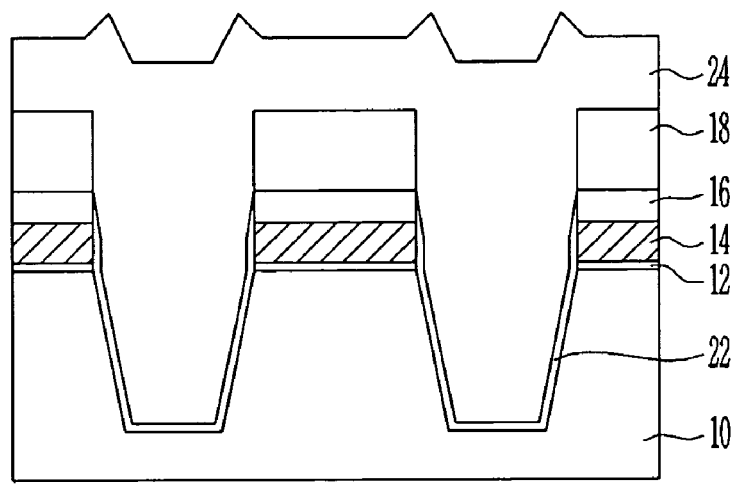

Referring to FIG. 4, a trench 20 is formed in FIG. 3, and then a wall oxide film 22 is formed on an inner surface of the trench 20 to be exposed and on inside walls of the tunnel oxide film 12, the first polysilicon film 14, and the buffer oxide film 16. The wall oxide film 22 serves for preventing from re-crystallization of the first polysilicon film 14. Furthermore, the wall oxide film 22 serves for compensating an etching loss of side walls of the trench 20 at the time of forming the trench 20, performing a rounding treatment to top or bottom corner portions of the trench 20, and reducing critical dimension of an active area. At that time, the wall oxide film 22 is formed using a dry oxidizing method at a temperature of 800° C. to 1000° C. to have a thickness of 30 Å to 100 Å for satisfying a monitoring wafer target standard. As a result, it is possible to restrict increment in a thickness of a buffer oxide film 16 due to oxidization of the first polysilicon film 14. The wall oxide film 22 is formed, and then the HDP oxide film 24 for the device isolation film becomes gap filling not to generate voids in the trench 20. At that time, the HDP oxide film 24 is deposited with a thickness of about 4000 Å to about 10000 Å.

Figure 5:
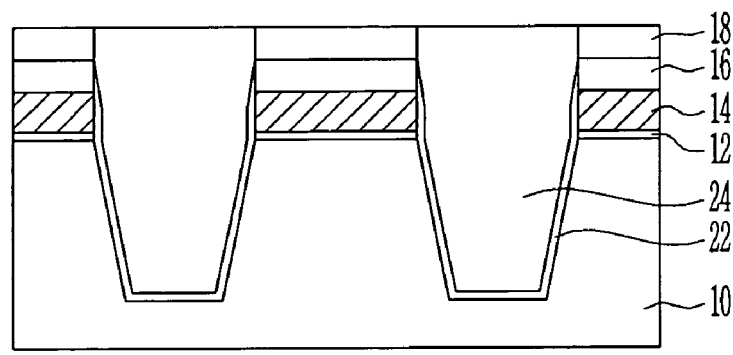

Referring to FIG. 5, the HDP oxide film 24 becomes gap filling in FIG. 4, and then top of the whole structure is planarized by a CMP process using the pad nitride film 18 as a barrier.

Figure 6:
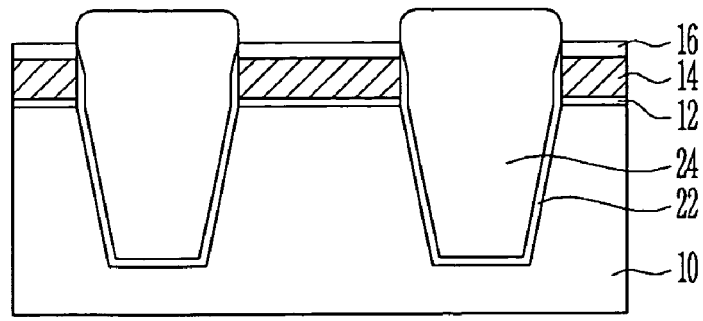

Referring to FIG. 6, the planarization process is carried out in FIG. 5, and then a strip process of removing the pad nitride film 18 is carried out. The strip process is carried out using phosphoric acid ($H_3PO_4$) to prevent the first polysilicon film 14 from attack of the buffer oxide film, by removing 50% of the buffer oxide film 16 to minimize HF dip time in a subsequent pre-treatment cleaning process.

Figure 7:
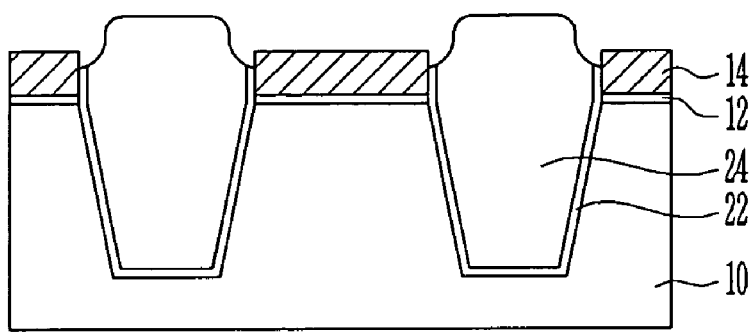

Referring to FIG. 7, the pre-treatment cleaning process is carried out after the strip process is carried out. It is preferable that the pre-treatment cleaning process is carried out with SC-1 ($NH_4OH/H_2O_2/H_2O$) and then with DHF (Diluted HF; HF: $H_2O$ is 1:50). By carrying out the pre-treatment cleaning process, the buffer oxide film 16 is removed completely and a part of the HDP oxide film 24 is removed. As a result, it is possible to obtain a slowness profile in which the buffer oxide film 16 remaining at an interface between the first polysilicon film 14 and the second polysilicon film 26 (to be formed in FIG. 8) is completely removed, and which is slowly sloped against a whole top surface. This result can be confirmed through the TEM photograph shown in FIG. 12.

Figure 8:
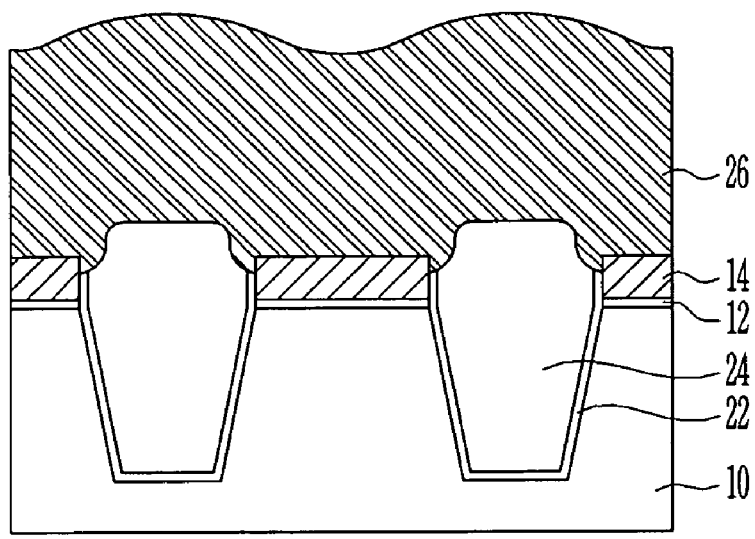

Referring to FIG. 8, the second polysilicon film 26 is deposited at top of the whole structure. At that time, the second polysilicon film 26 is deposited using $SiH_4$ gas or $Si_2H_6$ and $PH_3$ mixed gas as source gas at a temperature of 510° C. to 550° C. under a pressure of 0.1 torr to 3 torr by an LP-CVD method. In addition, the second polysilicon film 26 is deposited as a doped polysilicon film to have a thickness of 1000 Å to 2000 Å by giving a doped phosphorous concentration to a doping level of 1.0E20 atoms/cc to 2.0E20 atoms/cc.

Figure 9:
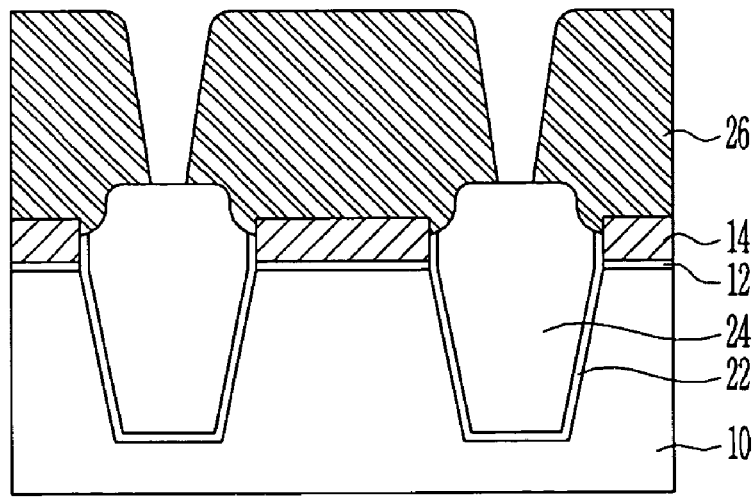

Referring to FIG. 9, the second polysilicon film 26 is deposited in FIG. 8, and then a floating gate is formed through a lithography process. At that time, the floating gate is formed by etching its outside wall vertically or etching its outside wall to have a slight slope. Accordingly, it is possible to ensure a space between neighbor floating gates (not shown).

As described above, it is possible to prevent the first polysilicon film from being additionally oxidized by forming the buffer oxide film to minimize a thickness between the first polysilicon film and the pad nitride film, whereby the buffer oxide film is uniformly removed, and to prevent the first polysilicon film from attack of solution $H_3PO_4$ used in the strip process of the pad nitride film. As a result, it is possible to improve characteristics of the semiconductor element.

Furthermore, it is possible to prevent the tunnel oxide film, which is an underlying layer, from being deteriorated by directly not contacting the first polysilicon film and the pad nitride film to relieve stress caused due to contacts between these films.

Furthermore, it is possible to improve characteristics of a dielectric film formed using subsequent processes by smoothing a surface roughness of the final floating gate after the second polysilicon film is deposited using the aforementioned processes.

Furthermore, it is possible to make a slowness profile by removing great portions of side walls and corners of the HDP oxide film when the buffer oxide film is removed using the pre-treatment cleaning process prior to depositing the second polysilicon film, so as to slowly slope projections of the HDP oxide film.

Furthermore, it is possible to prevent a gate oxide film from being thin, that is, to solve a problem that a thickness of trench corners deposited by a wall oxidation process is smaller than that to be desired in addition, since active area is ensured as much as a critical dimension, it is possible to ensure reliability of elements by improving electrical characteristics such as retention fail and rapid eliminating operation of elements.

Furthermore, it is possible to form a uniform tunnel oxide film within a channel width by forming the wall oxide film to protect the exposed tunnel oxide film to prevent from attack of the tunnel oxide film.

Furthermore, it is possible to realize a semiconductor element having high reliability with low production cost using the conventional apparatuses and processes without adding any other complex processes and apparatuses.

What is claimed is:

1. A method for forming a floating gate in a flash memory device, comprising the steps of:
   (a) providing a semiconductor substrate on which a tunnel oxide film and a first polysilicon film are formed;
   (b) sequentially forming a buffer oxide film and a pad nitride film on the first polysilicon film;
   (c) forming a trench in the semiconductor substrate;
   (d) depositing a device isolation oxide film to fill the trench, and then performing a planarization process using the pad nitride film as a barrier;
   (e) carrying out a strip process to simultaneously remove the pad nitride film and at least 50% of the buffer oxide film, leaving a reduced buffer oxide film on the first polysilicon film;
   (f) removing the reduced buffer oxide film using a pre-treatment cleaning process; and
   (g) depositing a second polysilicon film on the resulting structure and patterning the second polysilicon film with a patterning process, to form the floating gate including the first polysilicon film and the second polysilicon film.

2. The method of claim 1, wherein the buffer oxide film is deposited in part (b) with a thickness in the range of 30 Å to 40 Å.

3. The method of claim 1, wherein the buffer oxide film is deposited using high temperature oxide (HTO), a tetra ethyl ortho silicate (TEOS), and a DCS-HTO (DiChloroSilane ($SiH_2Cl_2$)-HTO).

4. The method of claim 1, after part (c) and before part (d), further comprising performing a wall oxidation process for forming a wall oxide film on an inner surface of the trench and on inside walls of the tunnel oxide film, the first polysilicon film, and the buffer oxide film.

5. The method of claim 4, wherein the wall oxidation process is carried out at a temperature in the range of 800° C. to 1000° C.

* * * * *